(12) United States Patent
Ichikawa

(10) Patent No.: US 8,325,452 B2
(45) Date of Patent: Dec. 4, 2012

(54) SEMICONDUCTOR DEVICE

(75) Inventor: Hiroaki Ichikawa, Azumino (JP)

(73) Assignee: Fuji Electric Co., Ltd. (JP)

( * ) Notice: Subject to any disclaimer, the term of this patent is extended or adjusted under 35 U.S.C. 154(b) by 1025 days.

(21) Appl. No.: 12/187,000

(22) Filed: Aug. 6, 2008

(65) Prior Publication Data

US 2009/0046405 A1 Feb. 19, 2009

(30) Foreign Application Priority Data

Aug. 6, 2007 (JP) ................................. 2007-204366

(51) Int. Cl.
*H02H 5/04* (2006.01)
(52) U.S. Cl. ...................................................... 361/93.8
(58) Field of Classification Search ................. 361/93.8, 361/103
See application file for complete search history.

(56) References Cited

U.S. PATENT DOCUMENTS

| | | | |
|---|---|---|---|
| 5,712,802 A * | 1/1998 | Kumar et al. ................. | 702/132 |
| 5,721,455 A | 2/1998 | Takashita | |
| 7,586,726 B2 * | 9/2009 | Maebara et al. ............. | 361/93.8 |
| 7,791,300 B2 * | 9/2010 | Katsuyama et al. .......... | 318/471 |
| 2003/0076232 A1 * | 4/2003 | Sato et al. ..................... | 340/679 |
| 2003/0076233 A1 * | 4/2003 | Sato et al. ..................... | 340/679 |
| 2004/0221217 A1 * | 11/2004 | Sato et al. ..................... | 714/745 |
| 2005/0197799 A1 | 9/2005 | Kamezawa et al. | |
| 2005/0204761 A1 * | 9/2005 | Karikomi et al. ............ | 62/228.1 |
| 2009/0161726 A1 * | 6/2009 | Miyamoto et al. ............ | 374/172 |

FOREIGN PATENT DOCUMENTS

| | | |
|---|---|---|
| JP | 7-14948 A | 1/1995 |
| JP | 8-51768 A | 2/1996 |
| JP | 9-148523 A | 6/1997 |
| JP | 2006-41407 A | 2/2006 |
| JP | 2006-49411 A | 2/2006 |
| WO | 2005/038919 A1 | 4/2005 |

* cited by examiner

*Primary Examiner* — Ronald W Leja
(74) *Attorney, Agent, or Firm* — Rossi, Kimms & McDowell LLP

(57) ABSTRACT

In order to enable detection of degradation of the heat dissipation from a semiconductor chip, even when the operating state of a semiconductor device cannot be predicted, a thermal resistance calculation circuit calculates the thermal resistance of the heat dissipation path from the semiconductor chip, based on the loss of a switching element calculated by a loss calculation circuit and the temperature of the semiconductor chip calculated by a temperature calculation portion, and when the voltage corresponding to the thermal resistance calculated by the thermal resistance calculation circuit exceeds a reference voltage, switching operation of the switching element is halted.

9 Claims, 5 Drawing Sheets

SEMICONDUCTOR DEVICE

BACKGROUND

The invention relates in general to a semiconductor device, and in particular relates to a semiconductor device which is suitable for application as a device provided with functions to monitor thermal resistance.

In power semiconductor devices, a semiconductor chip is mounted on a copper base with high thermal conductivity so as to efficiently dissipate heat from the semiconductor chip, with a ceramic substrate for insulation interposed, and solder is used for bonding of members between the semiconductor chip and the copper base. These members have large differences in thermal expansion coefficient, and stresses and strains occur between these members due to temperature cycles, so that the solder undergoes fatigue, and solder cracks occur. When a solder crack occurs, heat dissipation from the semiconductor chip is degraded, and the temperature of the semiconductor chip rises rapidly, leading to the danger of thermal failure of the semiconductor chip.

In order to avoid such danger in advance, life tests of semiconductor elements are performed to determine life acceleration factors, and by predicting the lifetime of a semiconductor element, the semiconductor device can be operated within the range of the predicted lifetime. Alternatively, a method can be used in which the temperature of the semiconductor chip is monitored, and upon detecting an anomalous rise in temperature, operation of the semiconductor device is forcibly halted.

FIG. 7 is a block diagram showing in summary the configuration of a conventional semiconductor device. In FIG. 7, a semiconductor chip 11 is provided on which is formed a switching element 12 which performs switching operation and a diode 13 used in detection of the temperature of the semiconductor chip 11. As the switching element 12, an IGBT (Insulated Gate Bipolar Transistor) can be used.

If an IGBT is used as the switching element 12, the emitter, with current divided from the IGBT collector current, is grounded via the resistance 18, and the gate of the IGBT is connected to the output terminal of a logical AND circuit 24 via a driving circuit 25, while the diode 13 is connected to the input terminal of a temperature calculation portion 17. The output terminal of the temperature calculation portion 17 is connected to the inverting input terminal of a comparator 23, a reference voltage source 22 is connected to the non-inverting input terminal of the comparator 23, the output terminal of the comparator 23 is connected to the inverting input terminal of the logical AND circuit 24, the non-inverting input terminal of the logical AND circuit 24 is connected to a signal input terminal, and the output terminal of the logical AND circuit 24 is connected to the input terminal of the driving circuit 25.

When a control signal which controls switching operation of the switching element 12 is applied to the gate of the switching element 12 via the logical AND circuit 24 and driving circuit 25, the switching element 12 is turned on, and current flows in the resistance 18. Then, as the temperature of the semiconductor chip 11 rises accompanying switching operation of the switching element 12, the current flowing in the diode 13 changes according to the temperature characteristic of the diode 13, and the signal from this diode 13 is input to the temperature calculation portion 17.

The temperature calculation portion 17 calculates the temperature of the semiconductor chip 11 based on the signal from the diode 13, and inputs a voltage corresponding to this temperature to the comparator 23. The comparator 23 compares the voltage corresponding to the temperature of the semiconductor chip 11 with a reference voltage, and if the temperature of the semiconductor chip 11 is equal to or above a prescribed value, sets the inverting input terminal of the logical AND circuit 24 to low level, to impede the input of the control signal to the gate of the switching element 12, and halt operation of the switching element 12.

For example, in Japanese Patent Laid-open No. H7-14948, a method is disclosed in which, by installing a thermocouple on a semiconductor element and components, the temperature during device use is constantly monitored, and degradation of various bonded portions and the state of cooling of the device can be ascertained.

Further, in for example Japanese Patent Laid-open No. H9-148523 (corresponding to U.S. Pat. No. 5,721,455), a method is disclosed in which an element is provided which detects increases in thermal resistance in a heat dissipation path which releases generated heat in a state of use of a semiconductor element, and in which output of the detection result to equipment exterior to the semiconductor device enables early detection of fragility due to the occurrence of cracks in solder which fix the insulating substrate for element mounting and the heat-dissipating substrate in a state of use.

Still further, in International Patent Application Publication No. WO2005/038919, a method is disclosed in which a metal wire is used to detect the characteristics of a bonded portion which bonds metals, and by using a threshold value determined from the relation between lifetime and an increase in resistance due to degradation of the bonded portion, degradation of the bonded portion is predicted.

However, in methods to predict the lifetime of a semiconductor element, there is the problem that, if the model case used in lifetime prediction differs from the actual operation pattern during operation, lifetime prediction may not be possible, or it may not be possible to avoid the danger that thermal failure of the semiconductor chip.

Further, in methods to monitor the temperature of the semiconductor chip, there is the problem that, when the semiconductor device operates at or below the rated current, even when a solder crack occurs, an anomalous increase in temperature of the semiconductor chip cannot be detected, and thermal failure of the semiconductor chip cannot be prevented in advance.

Hence, it would be desirable to provide a semiconductor device that enables detection of degradation of heat dissipation from a semiconductor chip, even in cases in which the operating state of the semiconductor device cannot be predicted.

SUMMARY OF THE INVENTION

A semiconductor device is provided that enables detection of degradation of heat dissipation from a semiconductor chip, even in cases in which the operating state of the semiconductor device cannot be predicted.

The semiconductor device preferably includes a semiconductor chip on which a switching element is formed; a mounting substrate on which the semiconductor chip is mounted with a solder layer intervening; a heat dissipation mechanism that dissipates heat generated by the semiconductor chip; a current detection circuit that detects current flowing in the switching element; a voltage detection circuit that detects the voltage applied to the switching element; a loss calculation circuit that, based on the current detected by the current detection circuit and the voltage detected by the voltage detection circuit, calculates the loss occurring in the switching element; a temperature detection mechanism that detects the temperature of the semiconductor chip; and, a thermal resistance calculation circuit that, based on the switching element loss calculated by the loss calculation circuit and the semiconductor chip temperature detected by the temperature detection means, calculates the thermal resistance in the dissipation path from the semiconductor chip.

In the above described device, the thermal resistance in the heat dissipation path from the semiconductor chip can be calculated, while actually operating the switching element. As a result it is possible to detect degradation of heat dissipation from the semiconductor chip even when the operating state of the semiconductor device cannot be predicted, and the occurrence of solder cracks can be ascertained reliably, so that thermal failure of the semiconductor chip can be prevented in advance.

Further, the thermal resistance calculation circuit preferably includes a temperature difference calculation portion, which calculates the temperature difference before and after the occurrence of the loss calculated by the loss calculation circuit by referencing the temperature detected by the temperature detection means, and a thermal resistance calculation portion, which calculates the thermal resistance in the heat dissipation path from the semiconductor chip based on the loss calculated by the loss calculation circuit and the temperature difference calculated by the temperature difference calculation portion. By detecting the semiconductor chip temperature, the thermal resistance in the heat dissipation path from the semiconductor chip can be calculated while actually operating the switching element, and degradation of heat dissipation from the semiconductor chip can be detected.

Further, the thermal resistance calculation circuit preferably calculates the integrated value of losses occurring in the switching element and the temperature difference of the semiconductor chip based on the time elapsed until saturation of temperature in the heat dissipation path from the semiconductor chip and the semiconductor chip temperature difference, and calculates the thermal resistance at a specific location on the heat dissipation path from the semiconductor chip. By changing the interval of sampling of the semiconductor chip temperature, the thermal resistance at a specific location in the heat dissipation path from the semiconductor chip can be calculated, and even in cases in which heat dissipation mean are provided to dissipate heat generated from the semiconductor chip, anomalies in the solder layer can be detected, so that the occurrence of solder cracks can be ascertained accurately.

Further, the semiconductor is preferably characterized in that by setting the time interval, over which the integrated value of losses occurring in the switching element and the semiconductor chip temperature difference are calculated, to 200 ms or less, the thermal resistance calculation circuit monitors anomalies in the solder layer fixing the semiconductor chip to the mounting substrate, and by setting the time interval, over which the integrated value of losses occurring in the switching element and the semiconductor chip temperature difference are calculated, to two seconds or less, the thermal resistance calculation circuit monitors anomalies in the contact face of the heat dissipation means, and by setting the time interval, over which the integrated value of losses occurring in the switching element and the semiconductor chip temperature difference are calculated, to two seconds or more, the thermal resistance calculation circuit monitors anomalies in the heat dissipation means. By changing the time interval for sampling the semiconductor chip temperature, it is possible to monitor not only anomalies in the solder layer, but anomalies in the contact face of the heat dissipation means and anomalies in the heat dissipation means also, and the accuracy of detection of degradation of heat dissipation from the semiconductor chip can be enhanced.

Further, the semiconductor device is preferably characterized in further including a comparison mechanism that compares the thermal resistance calculated by the thermal resistance calculation circuit with a prescribed value, and a protection circuit which, when the thermal resistance calculated by the thermal resistance calculation circuit exceeds the prescribed value, either halts operation of the switching element, or limits the current flowing in the switching element. When a solder crack occurs, operation of the switching element can be halted, and thermal failure of the semiconductor chip can be prevented in advance.

Further, the semiconductor device preferably includes a control circuit that controls switching operation of the switching element; a thermal resistance prediction circuit that calculates the switching element loss and the temperature based on control information controlling switching operation, and predicts the thermal resistance in the heat dissipation path from the semiconductor chip; a comparison mechanism that compares the thermal resistance calculated by the thermal resistance calculation circuit with the thermal resistance predicted by the thermal resistance prediction circuit; and a protection circuit which, when the thermal resistance calculated by the thermal resistance calculation circuit exceeds the thermal resistance predicted by the thermal resistance prediction circuit, either halts operation of the switching element, or limits the current flowing in the switching element. In such a device, while taking into consideration the thermal resistance of the unit as a whole, operation of the switching element can be halted, and thermal failure of the semiconductor chip can be prevented in advance.

As explained above, by means of this invention the thermal resistance in the heat dissipation path from the semiconductor chip can be calculated while actually operating a switching element. Hence even when the operating state of the semiconductor device cannot be predicted, degradation of heat dissipation from the semiconductor chip can be detected, and the occurrence of solder cracks can be reliably ascertained, so that thermal failure of the semiconductor chip can be prevented in advance.

BRIEF DESCRIPTION OF THE DRAWINGS

The invention will be described in greater detail with reference to certain preferred embodiments and the accompanying drawings, wherein.

DESCRIPTION OF THE PREFERRED EMBODIMENTS

Figure 1:
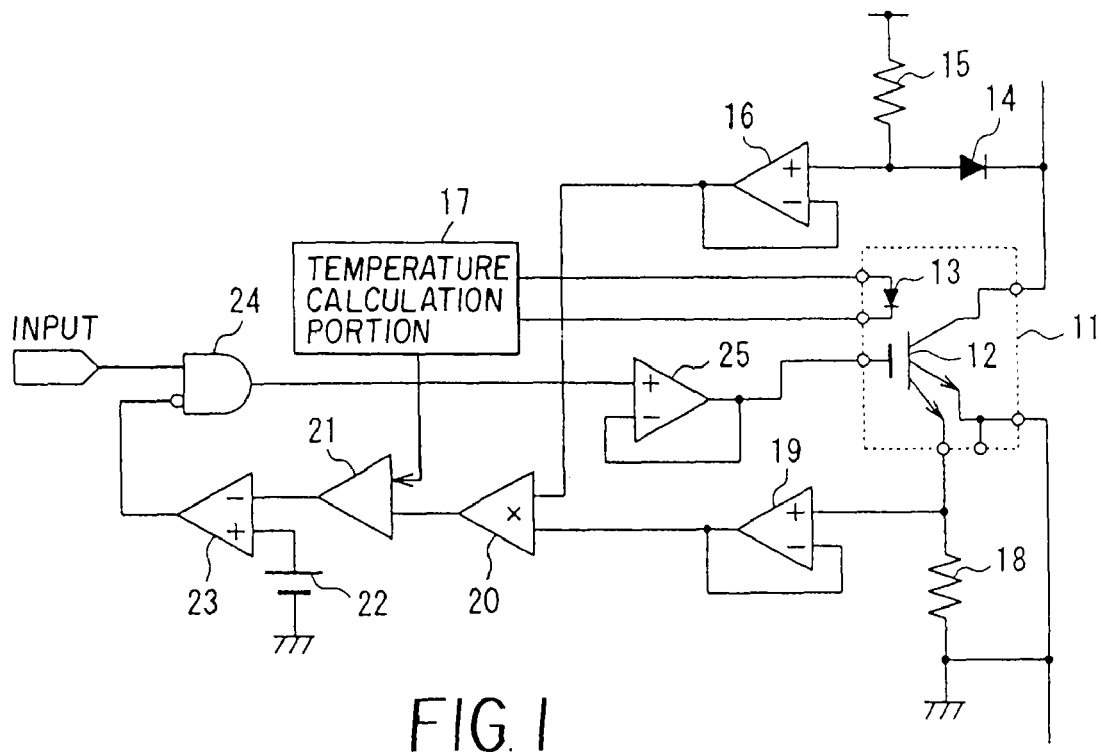
FIG. 1 is a block diagram showing in summary the configuration of the semiconductor device of a first aspect of the invention.

Semiconductor devices in accordance with the invention will now be explained in greater detail. FIG. 1 is a block diagram showing in summary the configuration of the semiconductor device of a first aspect of the invention. In FIG. 1, a switching element 12 which performs switching operation and a diode 13 used to detect the temperature of the semiconductor chip 11 are formed on the semiconductor chip 11. As the switching element 12, an IGBT (Insulated Gate Bipolar Transistor), a bipolar transistor, or a power MOSFET can be used. The semiconductor chip 11 can be mounted on a copper base with high thermal conductivity, with a ceramic substrate interposed for insulation, and solder can be used for bonding of members between the semiconductor chip and the copper base.

The semiconductor device provided with the semiconductor chip 11 is also provided with a voltage detection circuit 16 that detects the voltage applied to the switching element 12; a current detection circuit 19 that detects the current flowing in the switching element 12; a temperature calculation portion 17 that calculates the temperature of the semiconductor chip 11 based on signals output from the diode 13; a loss calculation circuit 20 that calculates losses occurring in the switching element 12, based on the current detected by the current detection circuit 19 and the voltage detected by the voltage detection circuit 16; a thermal resistance calculation circuit 21 that calculates the thermal resistance in the heat dissipation path from the semiconductor chip 11, based on the losses in the switching element 12 calculated by the loss calculation circuit 20 and the temperature of the semiconductor chip 11 calculated by the temperature calculation portion 17, and converts the result to a voltage corresponding to the thermal resistance, and outputs the voltage; a reference voltage source 22 that generates a reference voltage; a comparator 23 that compares the voltage corresponding to the thermal resistance calculated by the thermal resistance calculation circuit 21 with the reference voltage; a logical AND circuit 24 which, when the voltage corresponding to the thermal resistance calculated by the thermal resistance calculation circuit 21 exceeds the reference voltage, prevents output to the switching element 12 of the control signal that controls the switching operation of the switching element 12; and a driving circuit 25 that drives the switching element 12.

As just one example, op-amps connected for voltage following can be used for the voltage detection circuit 16, current detection circuit 19, and driving circuit 25, and a multiplier can be used as the loss calculation circuit 20. If an IGBT is used as the switching element 12, then the emitter current-divided from the IGBT is grounded via a resistance 18, the gate of the IGBT is connected to the output terminal of the logical AND circuit 24 via the driving circuit 25, and the diode 13 is connected to the input terminal of the temperature calculation portion 17.

The IGBT collector is connected to the input terminal of the voltage detection circuit 16 via the diode 14, connected so as to be reverse-biased, and the anode of the diode 14 is pull-up connected using a resistance 15. The diode 14 can prevent the high voltage of approximately several hundred volts applied to the switching element 12 from appearing on the side of the voltage detection circuit 16, which operates at a voltage of several tens of volts.

Further, the IGBT emitter is connected to the input terminal of the current detection circuit 19, the output terminal of the voltage detection circuit 16 is connected to one of the input terminals of the loss calculation circuit 20, and the other input terminal of the loss calculation circuit 20 is connected to the output terminal of the current detection circuit 19.

The output terminal of the temperature calculation portion 17 is connected to one of the input terminals of the thermal resistance calculation circuit 21. The output terminal of the loss calculation circuit 20 is connected to the other input terminal of the thermal resistance calculation circuit 21, the output terminal of the thermal resistance calculation circuit 21 is connected to the inverting input terminal of the comparator 23, the reference voltage source 22 is connected to the non-inverting input terminal of the comparator 23, and the output terminal of the comparator 23 is connected to the inverting input terminal of the logical AND circuit 24. A signal input terminal is connected to the non-inverting input terminal of the logical AND circuit 24, and the output terminal of the logical AND circuit 24 is connected to the input terminal of the driving circuit 25.

The switching element 12 is turned on when the control signal which controls switching operation of the switching element 12 is applied to the gate of the switching element 12 via the logical AND circuit 24 and driving circuit 25, and current flows in the resistance 18. Then, as the temperature of the semiconductor chip 11 rises accompanying switching operation of the switching element 12, the current flowing in the diode 13 changes in accordance with the temperature characteristic of the diode 13, and the signal from the diode 13 is input to the temperature calculation portion 17. The temperature calculation portion 17 calculates the temperature of the semiconductor chip 11 based on the signal from the diode 13, and inputs a voltage corresponding to this temperature to one of the input terminals of the thermal resistance calculation circuit 21.

The voltage applied to the collector of the switching element 12 is detected by the voltage detection circuit 16 via the diode 14, and the voltage detected by the voltage detection circuit 16 is input to one of the input terminals of the loss calculation circuit 20. The current flowing in the resistance 18 via the switching element 12 is detected by the current detection circuit 19, and the current detected by the current detection circuit 19 is input to the other input terminal of the loss calculation circuit 20. The loss calculation circuit 20 then calculates the loss occurring in the switching element 12 based on the current detected by the current detection circuit 19 and the voltage detected by the voltage detection circuit 16, and inputs this loss to the other input terminal of the thermal resistance calculation circuit 21.

Based on the loss of the switching element 12 calculated by the loss calculation circuit 20 and the temperature of the semiconductor chip 11 calculated by the temperature calculation portion 17, the thermal resistance calculation circuit 21 then calculates the thermal resistance of the heat dissipation path from the semiconductor chip 11, converts the result into a voltage corresponding to the thermal resistance, and outputs this voltage to the inverting input terminal of the comparator 23.

The comparator 23 compares the voltage corresponding to the thermal resistance calculated by the thermal resistance calculation circuit 21 with the reference voltage, and if the voltage corresponding to the thermal resistance calculated by the thermal resistance calculation circuit 21 is equal to or above the reference voltage, sets the inverting input terminal of the logical AND circuit 24 to low level, to impede the input of control signals to the gate of the switching element 12 and cause operation of the switching element 12 to be halted.

By this means, the thermal resistance of the heat dissipation path from the semiconductor chip 11 can be calculated while actually operating the switching element 12. Hence, even when the operating state of the semiconductor device cannot be predicted, degradation of heat dissipation from the semiconductor chip 11 can be detected, and the occurrence of solder cracks can be accurately ascertained, so that thermal failure of the semiconductor chip 11 can be prevented in advance.

In the above-described embodiment, a method was explained in which, when the voltage corresponding to the thermal resistance calculated by the thermal resistance calculation circuit 21 becomes equal to or greater than the reference voltage, operation of the switching element 12 is halted; however, when the voltage corresponding to the thermal resistance calculated by the thermal resistance calculation circuit 21 becomes equal to or greater than the reference voltage, the current flowing in the switching element 12 may instead be decreased in stages.

Figure 2:
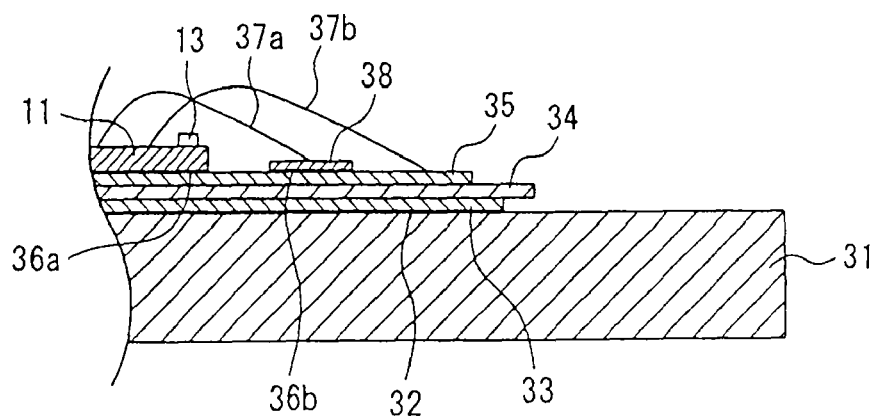
FIG. 2 is a cross-sectional view showing the mounted structure of the semiconductor chip 11 of FIG. 1.

FIG. 2 is a cross-sectional view showing the mounted structure of the semiconductor chip 11 of FIG. 1. In FIG. 2, semiconductor chips 11 and 38 are mounted on a copper plate 35 with solder layers 36a and 36b respectively intervening; the copper plate 35 is placed on a ceramic substrate 34, the ceramic substrate 34 is placed on a copper plate 33, and the copper plate 33 is connected to a copper base 31 with a solder layer 32 intervening. On the semiconductor chip 11, an IGBT or other switching element 12 can be formed, and on the semiconductor chip 38, a flywheel diode connected in reverse in parallel with the IGBT can be formed; on the semiconductor chip 11, a diode 13 which detects the temperature of the semiconductor chip 11 can be formed. The semiconductor chips 11 and 38 and the copper plate 35 can be connected via bonding wires 37a and 37b. On the copper base 31, a heat sink or other cooling member, which dissipates the heat generated by the semiconductor chip 11, can be installed.

By using the thermal resistance calculation circuit 21 of FIG. 1 to calculate the thermal resistance of the heat dissipation path from the semiconductor chip 11, even when the operating state of the semiconductor device cannot be predicted, degradation of the heat dissipation from the semiconductor chip 11 can be detected, and thermal failure of the semiconductor chip 11 can be prevented in advance. Here, the thermal resistance calculation circuit 21 can calculate the integrated losses occurring in the switching element 12 and the temperature difference of the semiconductor chip 11 based on the time until saturation of the temperature of the heat dissipation path from the semiconductor chip 11, and can calculate the thermal resistance of a specific location on the heat dissipation path from the semiconductor chip.

For example, the time to saturation of the temperature of the solder layer 36a in the heat dissipation path from the semiconductor chip 11 is 200 ms or less, the time to saturation of the temperature at the contact surface with the cooling member which dissipates heat generated by the semiconductor chip 11 is 2 seconds or less, and the time to saturation of the temperature of the cooling body which dissipates heat generated by the semiconductor chip 11 is from several seconds to several tens of seconds. Hence, by changing the interval of sampling of the temperature of the semiconductor chip 11, the thermal resistance at a specific location on the heat dissipation path from the semiconductor chip 11 can be calculated, and even when a cooling body which dissipates heat generated by the semiconductor chip 11 is provided, an anomaly in the solder layer 36a can be detected, so that the occurrence of solder cracks can be accurately ascertained.

Figure 3:
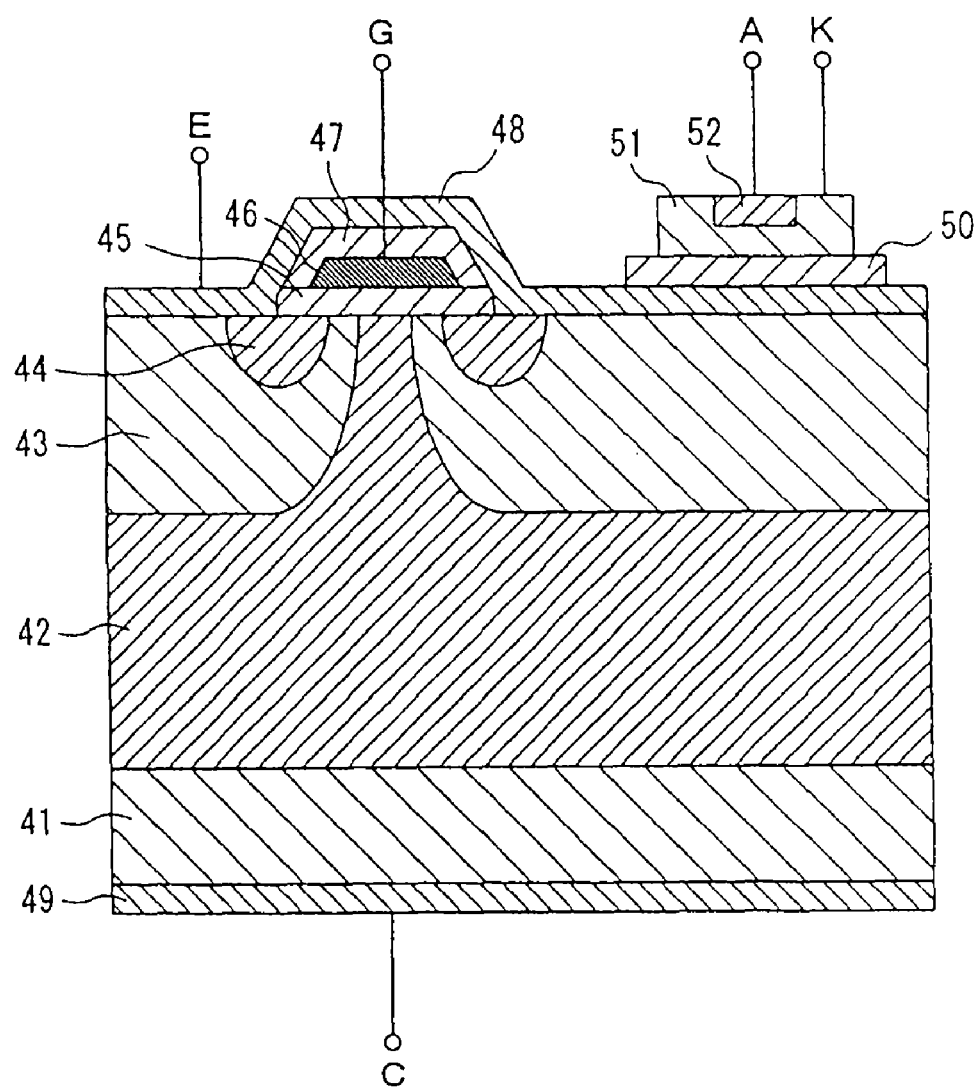
FIG. 3 is a cross-sectional view showing in summary the configuration of the semiconductor chip 11 of FIG. 1.

FIG. 3 is a cross-sectional view showing in summary the configuration of the semiconductor chip 11 of FIG. 1. In FIG. 3, when an IGBT is formed on the semiconductor chip 11, an N-type semiconductor layer 42 is formed on a P-type semiconductor substrate 41, and a gate electrode 46 is formed, with a gate insulating film 45 intervening, on the channel region formed in the N-type semiconductor layer 42. On the N-type semiconductor layer 42 is formed a P-type semiconductor layer 43, arranged on both sides of the gate electrode 46, and on the P-type semiconductor layer 43 is formed an N-type semiconductor layer 44, arranged so as to be positioned on both ends of the gate electrode 46. An emitter electrode 48 is formed on the gate electrode 46 with an insulating layer 47 intervening, so as to be in contact with the P-type semiconductor layer 43 and N-type semiconductor layer 44, and on the rear face of the P-type semiconductor substrate 41 is formed a collector electrode 49.

Further, an N-type semiconductor layer 51 is formed on the P-type semiconductor layer 43 with an insulating layer 50 intervening, and a P-type semiconductor layer 52 is formed on the N-type semiconductor layer 51, to form a diode which detects the temperature of the semiconductor chip 11. The gate electrode 46 is connected to the gate terminal G, the emitter electrode 48 is connected to the emitter terminal E, the collector electrode 49 is connected to the collector terminal C, the N-type semiconductor layer 51 is connected to the anode A, and the P-type semiconductor layer 52 is connected to the cathode K.

Here, by positioning a diode comprising the N-type semiconductor layer 51 and P-type semiconductor layer 52 above the P-type semiconductor layer 43, the temperature of the semiconductor chip 11 can be detected with hardly any time lag, and the thermal resistance at a specific location in the heat dissipation path from the semiconductor chip 11 can be accurately calculated.

Figure 4:
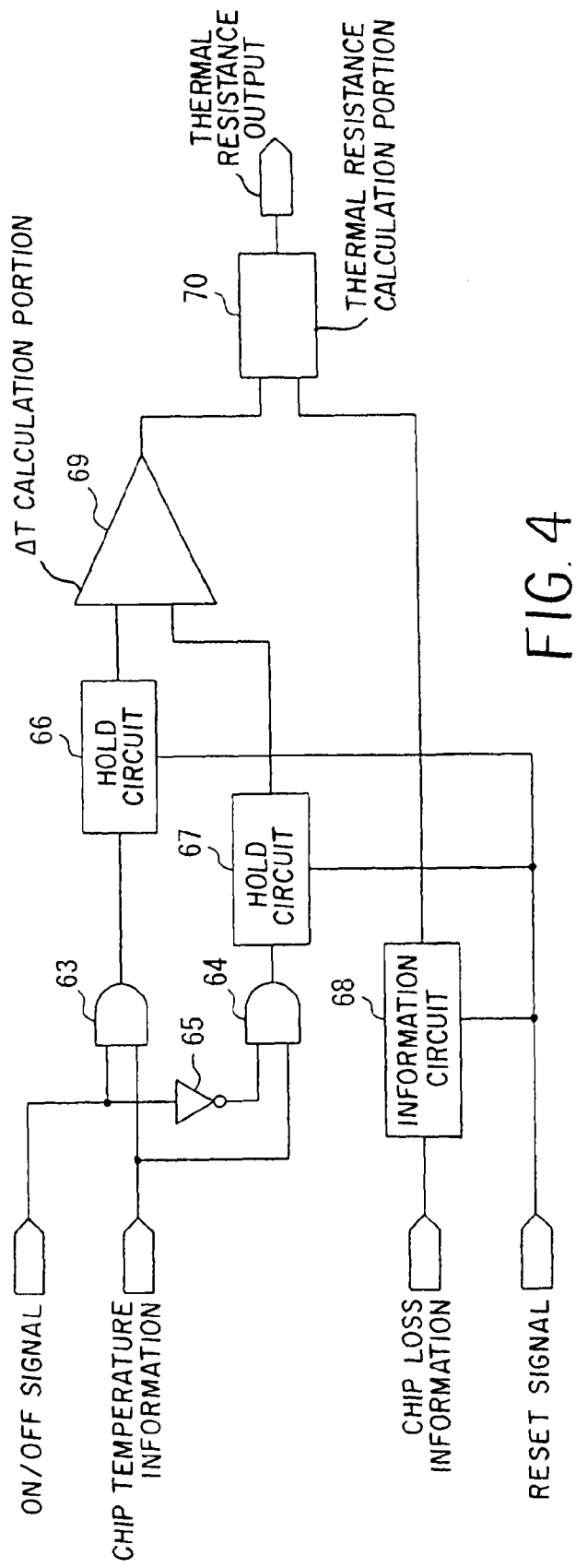
FIG. 4 is a block diagram showing in summary the configuration of the thermal resistance calculation circuit of FIG. 1.

FIG. 4 is a block diagram showing in summary the configuration of the thermal resistance calculation circuit of FIG. 1. In FIG. 4, the thermal resistance calculation circuit 21 is provided with a logical AND circuit 63 that outputs chip temperature information to the hold circuit 66 when an on/off signal is on; a logical AND circuit 64 that outputs chip temperature information to the hold circuit 67 when the on/off signal is off; an inverter 65 that inverts the on/off signal; a hold circuit 66 that holds the output from the logical AND circuit 63 based on the riding edge of a reset signal; a hold circuit 67 that holds the output from the logical AND circuit 64 based on the falling edge of the reset signal; an integration circuit 68 that integrates the losses calculated by the loss calculation circuit 20; a temperature difference calculation portion 69 that calculates the temperature difference between sampling intervals of the hold circuits 66, 67; and a thermal resistance calculation portion 70 that calculates the thermal resistance based on the temperature difference calculated by the temperature difference calculation portion 69 and the integrated loss value integrated by the integration circuit 68.

Figure 5:
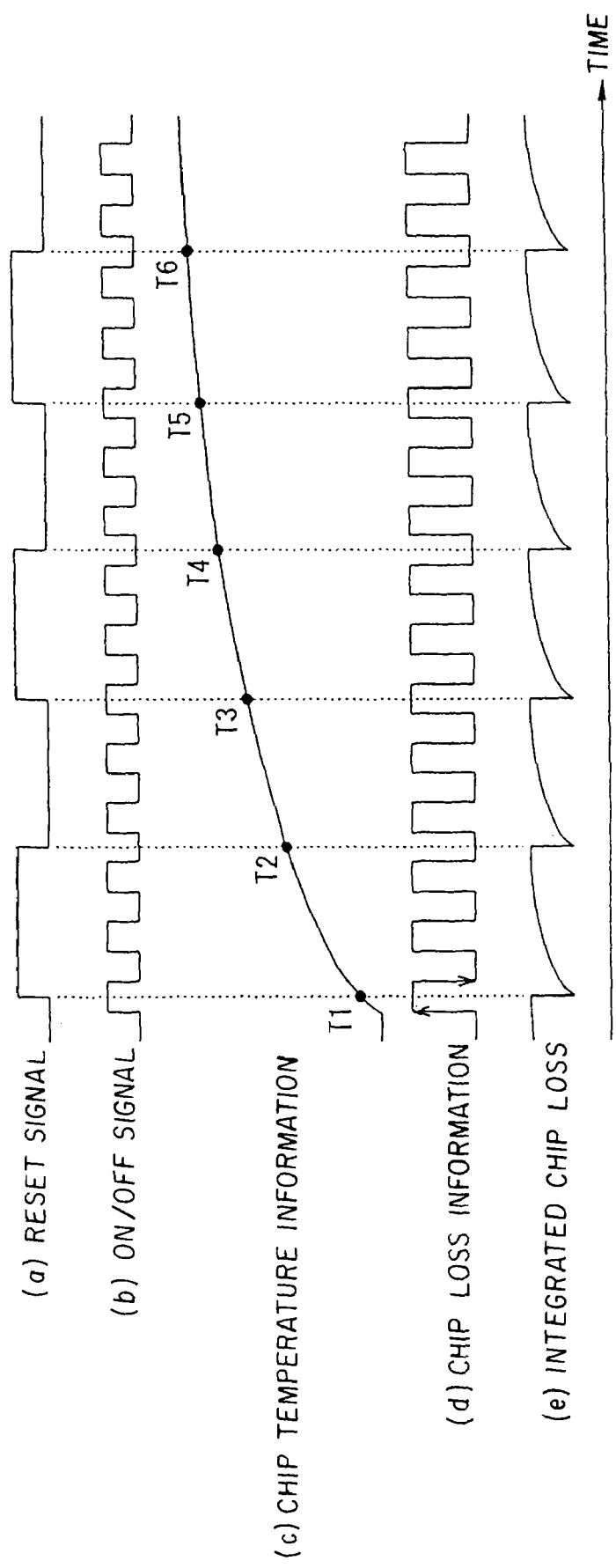
FIG. 5 is a timing chart showing operations to calculate thermal resistance in the thermal resistance calculation circuit of FIG. 4.

FIG. 5 is a timing chart showing an operation to calculate the thermal resistance in the thermal resistance calculation circuit of FIG. 4. In FIG. 5, the pulse width of the reset signal can be set to the time until saturation of the temperature in the dissipation path from the semiconductor chip 11. For example, when calculating the thermal resistance of the solder layer 36a in the heat dissipation path from the semiconductor chip 11, the time can be set to 200 ms or less; when calculating the thermal resistance at the contact surface with the cooling member which dissipates heat generated by the semiconductor chip 11, the time can be set to 2 seconds or less; and when calculating the thermal resistance of the cooling body which dissipates heat generated by the semiconductor chip 11, the time can be set from several seconds to several tens of minutes. Further, the reset signal can be adjusted so as to be rising when the on/off signals which turn on/off the switching element 12 of FIG. 1 is high, and falling when the on/off signal is low.

The chip temperature information calculated by the temperature calculation portion 17 of FIG. 1 is input to the logical AND circuits 63 and 64; when the on/off signal is on, the logical AND circuit 63 outputs the chip temperature information calculated by the temperature calculation portion 17 to the hold circuit 66. The hold circuit 66 captures the chip temperature information in synchronization with the rising edge of the reset signal, and can hold the chip temperature information when the chip temperature is T1.

When the on/off signal is off, the logical AND circuit 64 outputs the chip temperature information calculated by the temperature calculation portion 17 to the hold circuit 67. The hold circuit 67 captures the chip temperature information in synchronization with the falling edge of the reset signal, and can hold the chip temperature information when the chip temperature is T2.

The chip temperature information when the chip temperature is T1 and the chip temperature information when the chip temperature is T2 are sent to the temperature difference calculation portion 69, the difference between the chip temperatures T1 and T2 is calculated by the temperature difference calculation portion 69, and the result is sent to the thermal resistance calculation portion 70.

The loss calculated by the loss calculation circuit 20 is sent to the integration circuit 68, losses calculated by the loss calculation circuit 20 are integrated by the integration circuit 68 while resetting on either the rising edge or the falling edge of the reset signal, and the results are sent to the thermal resistance calculation portion 70. The thermal resistance calculation portion 70 calculates the thermal resistance, based on the temperature difference (T2-T1) calculated by the temperature difference calculation portion 69 and the loss integration value P obtained by integration by the integration circuit 68, and the result is output to the comparator 23 of FIG. 1.

The thermal resistance calculation portion 70 can calculate the thermal resistance Rth using the following formula, employing the temperature difference (T2-T1) calculated by the temperature difference calculation portion 69 and the loss integration value P obtained by integration by the integration circuit 68.

$$Rth=(T2-T1)/P$$

Accordingly, by changing the interval for sampling of the temperature of the semiconductor chip 11 in FIG. 1, not only can anomalies in the solder layer 36a of FIG. 2 be monitored, but anomalies at the contact surface with the cooling member and anomalies in the cooling member can also be monitored, and the accuracy of detection of degradation of the heat dissipation from the semiconductor chip 11 can be improved.

Figure 6:
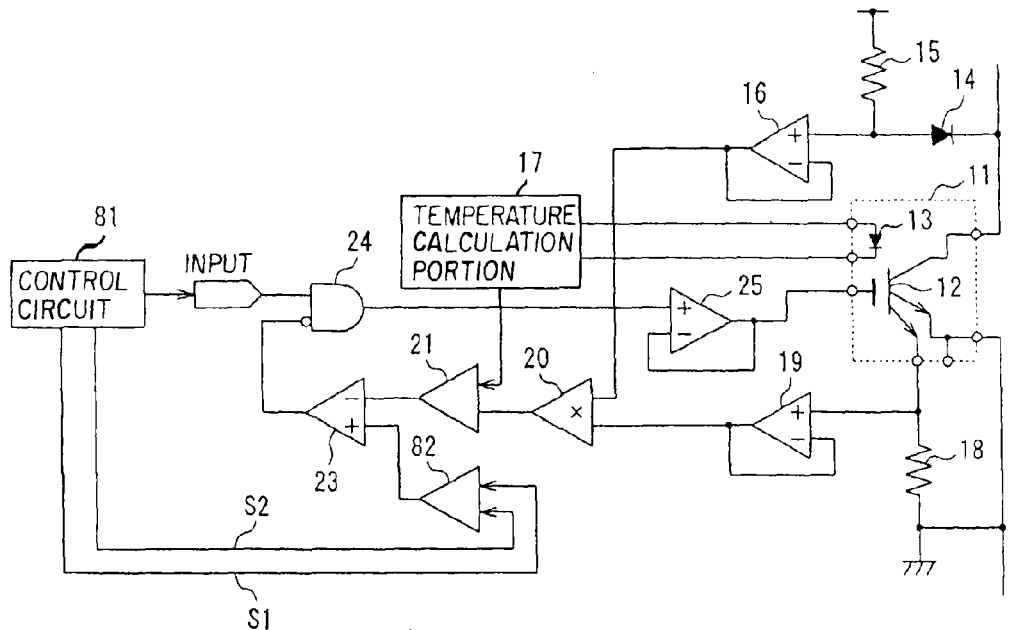
FIG. 6 is a block diagram showing in summary the configuration of the semiconductor device of a second aspect of the invention.
Figure 7:
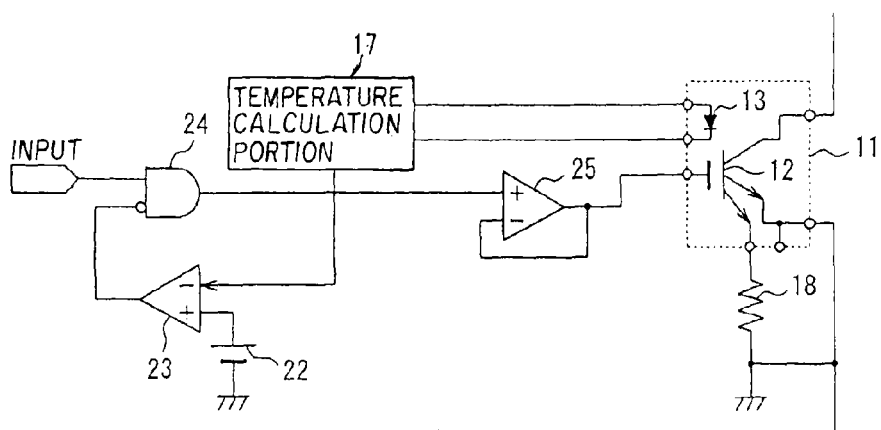
FIG. 7 is a block diagram showing in summary the configuration of a semiconductor device of the prior art.

FIG. 6 is a block diagram showing in summary the configuration of the semiconductor device of a second aspect of the invention. In FIG. 6, in addition to the configuration of FIG. 1, the semiconductor device is provided with a control circuit 81 which controls switching operation of the switching element 12, as well as a thermal resistance prediction circuit 82 in place of the reference voltage source 22 of FIG. 1. Here, the thermal resistance prediction circuit 82 predicts the thermal resistance of the heat dissipation path from the semiconductor chip 11, based on the loss S1 of the switching element 12 calculated by the control circuit 81 and the temperature S2 of the semiconductor chip 11 calculated by the control circuit 81, converts the result into a voltage corresponding to the thermal resistance, and outputs the voltage to the comparator 23.

The control circuit 81 can hold formulas which can be used, upon being provided with control signals to control switching operation of the switching element 12, to calculate the current flowing in the switching element 12, the voltage applied to the switching element 12, and the temperature of the semiconductor chip 11. When control signals output from the control circuit 81 are applied to the gate of the switching element 12 via the logical AND circuit 24 and driving circuit 25, the switching element 12 is turned on, and current flows in the resistance 18. Then, when the temperature of the semiconductor chip 11 rises accompanying switching operation of the switching element 12, the current flowing in the diode 13 changes according to the temperature characteristic of the diode 13, and a signal from the diode 13 is input to the temperature calculation portion 17.

Then, the temperature calculation portion 17 calculates the temperature of the semiconductor chip 11 based on the signal from the diode 13, and inputs a voltage corresponding to the temperature to one of the input terminals of the thermal resistance calculation circuit 21. The voltage applied to the collector of the switching element 12 is detected by the voltage detection circuit 16 via the diode 14, and the voltage detected by the voltage detection circuit 16 is input to one input terminal of the loss calculation circuit 20. The current flowing in the resistance 18 via the switching element 12 is detected by the current detection circuit 19, and the current detected by the current detection circuit 19 is input to the other input terminal of the loss calculation circuit 20.

Then, the loss calculation circuit 20 calculates the loss occurring in the switching element 12 based on the current detected by the current detection circuit 19 and the voltage detected by the voltage detection circuit 16, and inputs the loss to the other input terminal of the thermal resistance calculation circuit 21. The thermal resistance calculation circuit 21 then calculates the thermal resistance of the heat dissipation path from the semiconductor chip 11, based on the loss of the switching element 12 calculated by the loss calculation circuit 20 and the temperature of the semiconductor chip 11 calculated by the temperature calculation portion 17, converts the result into a voltage corresponding to the thermal resistance, and outputs the voltage to the inverting input terminal of the comparator 23.

When the control circuit 81 outputs a control signal, the loss S1 of the switching element 12 and temperature S2 of the semiconductor chip 11 are predicted and are output to the thermal resistance prediction circuit 82. Then, the thermal resistance prediction circuit 82 predicts the thermal resistance of the heat dissipation path from the semiconductor chip 11 based on the loss S1 of the switching element 12 and the temperature S2 of the semiconductor chip 11, and outputs the result to the comparator 23.

The comparator 23 compares the thermal resistance calculated by the thermal resistance calculation circuit 21 with the thermal resistance predicted by the thermal resistance prediction circuit 82. If the thermal resistance calculated by the thermal resistance calculation circuit 21 becomes equal to or greater than the thermal resistance predicted by the thermal resistance prediction circuit 82, the inverting input terminal of the logical AND circuit 24 is set to low level, input of control signals to the gate of the switching element 12 is impeded, and operation of the switching element 12 is halted.

Accordingly, in this device, operation of the switching element 12 can be halted, and thermal failure of the semiconductor chip 11 can be prevented in advance, while taking into account the thermal resistance of the entire unit including the cooling member.

This application is based on, and claims priority to, Japanese Patent Application No: 2007-204366, filed on Aug. 6, 2007. The disclosure of the priority application, in its entirety, including the drawings, claims, and the specification thereof, is incorporated herein by reference.

What is claimed is:

1. A semiconductor device, comprising:
   a semiconductor chip on which a switching element is formed;
   a mounting substrate on which the semiconductor chip is mounted with an intervening solder layer;
   a heat dissipation mechanism that dissipates heat generated by the semiconductor chip;
   a current detection circuit that detects current flowing in the switching element;
   a voltage detection circuit that detects a voltage applied to the switching element;
   a loss calculation circuit that calculates a loss occurring in the switching element based on the current detected by the current detection circuit and the voltage detected by the voltage detection circuit;
   a temperature detection mechanism that detects a temperature of the semiconductor chip; and
   a thermal resistance calculation circuit that calculates a thermal resistance in a dissipation path from the semiconductor chip based on the switching element loss calculated by the loss calculation circuit and the semiconductor chip temperature detected by the temperature detection mechanism;
   wherein the thermal resistance calculation circuit comprises:
   a temperature difference calculation portion that calculates the temperature difference before and after the occurrence of the loss calculated by the loss calculation circuit by referencing the temperature detected by the temperature detection mechanism; and
   a thermal resistance calculation portion that calculates the thermal resistance in the heat dissipation path from the semiconductor chip based on the loss calculated by the loss calculation circuit and the temperature difference calculated by the temperature difference calculation portion;
   wherein the thermal resistance calculation circuit calculates an integrated value of losses occurring in the switching element and the temperature difference of the semiconductor chip based on time elapsed until saturation of temperature in the heat dissipation path from the semiconductor chip and a semiconductor chip temperature difference, and calculates the thermal resistance at a specific location on the heat dissipation path from the semiconductor chip; and
   wherein by setting a time interval, over which the integrated value of losses occurring in the switching element and the semiconductor chip temperature difference are calculated, to 200 ms or less, the thermal resistance calculation circuit monitors anomalies in the solder layer fixing the semiconductor chip to the mounting substrate, and by setting the time interval, over which the integrated value of losses occurring in the switching element and the semiconductor chip temperature difference are calculated, to two seconds or less, the thermal resistance calculation circuit monitors anomalies in a contact face of the heat dissipation means, and by setting the time interval, over which the integrated value of losses occurring in the switching element and the semiconductor chip temperature difference are calculated, to two seconds or more, the thermal resistance calculation circuit monitors anomalies in the heat dissipation mechanism.

2. The semiconductor device to claim 1, further comprising:
   a comparison mechanism that compares the thermal resistance calculated by the thermal resistance calculation circuit with a prescribed value; and
   a protection circuit that either halts operation of the switching element or limits the current flowing in the switching element, when the thermal resistance calculated by the thermal resistance calculation circuit exceeds the prescribed value.

3. The semiconductor device according to claim 1, further comprising:
   a control circuit that controls switching operation of the switching element;
   a thermal resistance prediction circuit that calculates the switching element loss and temperature based on control information controlling the switching operation, and predicts the thermal resistance in the heat dissipation path from the semiconductor chip;
   a comparison mechanism that compares the thermal resistance calculated by the thermal resistance calculation circuit with the thermal resistance predicted by the thermal resistance prediction circuit; and
   a protection circuit that either halts operation of the switching element or limits the current flowing in the switching element, when the thermal resistance calculated by the thermal resistance calculation circuit exceeds the thermal resistance predicted by the thermal resistance prediction circuit.

4. A semiconductor device, comprising:
   a semiconductor chip on which a switching element is formed;
   a mounting substrate on which the semiconductor chip is mounted with an intervening solder layer;
   a heat dissipation mechanism that dissipates heat generated by the semiconductor chip;
   a current detection circuit that detects current flowing in the switching element;
   a voltage detection circuit that detects a voltage applied to the switching element;
   a loss calculation circuit that calculates a loss occurring in the switching element based on the current detected by the current detection circuit and the voltage detected by the voltage detection circuit;
   a temperature detection mechanism that detects a temperature of the semiconductor chip; and
   a thermal resistance calculation circuit that calculates a thermal resistance in a dissipation path from the semiconductor chip based on the switching element loss calculated by the loss calculation circuit and the semiconductor chip temperature detected by the temperature detection mechanism;
   the semiconductor device further comprising:
   a comparison mechanism that compares the thermal resistance calculated by the thermal resistance calculation circuit with a prescribed value; and
   a protection circuit that either halts operation of the switching element or limits the current flowing in the switching element, when the thermal resistance calculated by the thermal resistance calculation circuit exceeds the prescribed value.

5. A semiconductor device, comprising:
a semiconductor chip on which a switching element is formed;
a mounting substrate on which the semiconductor chip is mounted with an intervening solder layer;
a heat dissipation mechanism that dissipates heat generated by the semiconductor chip;
a current detection circuit that detects current flowing in the switching element;
a voltage detection circuit that detects a voltage applied to the switching element;
a loss calculation circuit that calculates a loss occurring in the switching element based on the current detected by the current detection circuit and the voltage detected by the voltage detection circuit;
a temperature detection mechanism that detects a temperature of the semiconductor chip; and
a thermal resistance calculation circuit that calculates a thermal resistance in a dissipation path from the semiconductor chip based on the switching element loss calculated by the loss calculation circuit and the semiconductor chip temperature detected by the temperature detection mechanism;
the semiconductor device further comprising:
a control circuit that controls switching operation of the switching element;
a thermal resistance prediction circuit that calculates the switching element loss and temperature based on control information controlling the switching operation, and predicts the thermal resistance in the heat dissipation path from the semiconductor chip;
a comparison mechanism that compares the thermal resistance calculated by the thermal resistance calculation circuit with the thermal resistance predicted by the thermal resistance prediction circuit; and
a protection circuit that either halts operation of the switching element or limits the current flowing in the switching element, when the thermal resistance calculated by the thermal resistance calculation circuit exceeds the thermal resistance predicted by the thermal resistance prediction circuit.

6. A semiconductor device, comprising:
a semiconductor chip on which a switching element is formed;
a mounting substrate on which the semiconductor chip is mounted with an intervening solder layer;
a heat dissipation mechanism that dissipates heat generated by the semiconductor chip;
a current detection circuit that detects current flowing in the switching element;
a voltage detection circuit that detects a voltage applied to the switching element;
a loss calculation circuit that calculates a loss occurring in the switching element based on the current detected by the current detection circuit and the voltage detected by the voltage detection circuit;
a temperature detection mechanism that detects a temperature of the semiconductor chip; and
a thermal resistance calculation circuit that calculates a thermal resistance in a dissipation path from the semiconductor chip based on the switching element loss calculated by the loss calculation circuit and the semiconductor chip temperature detected by the temperature detection mechanism;
wherein the thermal resistance calculation circuit comprises:
a temperature difference calculation portion that calculates the temperature difference before and after the occurrence of the loss calculated by the loss calculation circuit by referencing the temperature detected by the temperature detection mechanism; and
a thermal resistance calculation portion that calculates the thermal resistance in the heat dissipation path from the semiconductor chip based on the loss calculated by the loss calculation circuit and the temperature difference calculated by the temperature difference calculation portion;
the semiconductor device further comprising:
a comparison mechanism that compares the thermal resistance calculated by the thermal resistance calculation circuit with a prescribed value; and
a protection circuit that either halts operation of the switching element or limits the current flowing in the switching element, when the thermal resistance calculated by the thermal resistance calculation circuit exceeds the prescribed value.

7. A semiconductor device, comprising:
a semiconductor chip on which a switching element is formed;
a mounting substrate on which the semiconductor chip is mounted with an intervening solder layer;
a heat dissipation mechanism that dissipates heat generated by the semiconductor chip;
a current detection circuit that detects current flowing in the switching element;
a voltage detection circuit that detects a voltage applied to the switching element;
a loss calculation circuit that calculates a loss occurring in the switching element based on the current detected by the current detection circuit and the voltage detected by the voltage detection circuit;
a temperature detection mechanism that detects a temperature of the semiconductor chip; and
a thermal resistance calculation circuit that calculates a thermal resistance in a dissipation path from the semiconductor chip based on the switching element loss calculated by the loss calculation circuit and the semiconductor chip temperature detected by the temperature detection mechanism;
wherein the thermal resistance calculation circuit comprises:
a temperature difference calculation portion that calculates the temperature difference before and after the occurrence of the loss calculated by the loss calculation circuit by referencing the temperature detected by the temperature detection mechanism; and
a thermal resistance calculation portion that calculates the thermal resistance in the heat dissipation path from the semiconductor chip based on the loss calculated by the loss calculation circuit and the temperature difference calculated by the temperature difference calculation portion;
the semiconductor device further comprising:
a control circuit that controls switching operation of the switching element;
a thermal resistance prediction circuit that calculates the switching element loss and temperature based on control information controlling the switching operation, and predicts the thermal resistance in the heat dissipation path from the semiconductor chip;
a comparison mechanism that compares the thermal resistance calculated by the thermal resistance calculation circuit with the thermal resistance predicted by the thermal resistance prediction circuit; and
a protection circuit that either halts operation of the switching element or limits the current flowing in the switching element, when the thermal resistance calculated by the thermal resistance calculation circuit exceeds the thermal resistance predicted by the thermal resistance prediction circuit.

8. A semiconductor device, comprising:
a semiconductor chip on which a switching element is formed;
a mounting substrate on which the semiconductor chip is mounted with an intervening solder layer;
a heat dissipation mechanism that dissipates heat generated by the semiconductor chip;
a current detection circuit that detects current flowing in the switching element;
a voltage detection circuit that detects a voltage applied to the switching element;
a loss calculation circuit that calculates a loss occurring in the switching element based on the current detected by the current detection circuit and the voltage detected by the voltage detection circuit;
a temperature detection mechanism that detects a temperature of the semiconductor chip; and
a thermal resistance calculation circuit that calculates a thermal resistance in a dissipation path from the semiconductor chip based on the switching element loss calculated by the loss calculation circuit and the semiconductor chip temperature detected by the temperature detection mechanism;
wherein the thermal resistance calculation circuit comprises:
a temperature difference calculation portion that calculates the temperature difference before and after the occurrence of the loss calculated by the loss calculation circuit by referencing the temperature detected by the temperature detection mechanism; and
a thermal resistance calculation portion that calculates the thermal resistance in the heat dissipation path from the semiconductor chip based on the loss calculated by the loss calculation circuit and the temperature difference calculated by the temperature difference calculation portion; and
wherein the thermal resistance calculation circuit calculates an integrated value of losses occurring in the switching element and the temperature difference of the semiconductor chip based on time elapsed until saturation of temperature in the heat dissipation path from the semiconductor chip and a semiconductor chip temperature difference, and calculates the thermal resistance at a specific location on the heat dissipation path from the semiconductor chip;
the semiconductor device further comprising:
a comparison mechanism that compares the thermal resistance calculated by the thermal resistance calculation circuit with a prescribed value; and
a protection circuit that either halts operation of the switching element or limits the current flowing in the switching element, when the thermal resistance calculated by the thermal resistance calculation circuit exceeds the prescribed value.

9. A semiconductor device, comprising:
a semiconductor chip on which a switching element is formed;
a mounting substrate on which the semiconductor chip is mounted with an intervening solder layer;
a heat dissipation mechanism that dissipates heat generated by the semiconductor chip;
a current detection circuit that detects current flowing in the switching element;
a voltage detection circuit that detects a voltage applied to the switching element;
a loss calculation circuit that calculates a loss occurring in the switching element based on the current detected by the current detection circuit and the voltage detected by the voltage detection circuit;
a temperature detection mechanism that detects a temperature of the semiconductor chip; and
a thermal resistance calculation circuit that calculates a thermal resistance in a dissipation path from the semiconductor chip based on the switching element loss calculated by the loss calculation circuit and the semiconductor chip temperature detected by the temperature detection mechanism;
wherein the thermal resistance calculation circuit comprises:
a temperature difference calculation portion that calculates the temperature difference before and after the occurrence of the loss calculated by the loss calculation circuit by referencing the temperature detected by the temperature detection mechanism; and
a thermal resistance calculation portion that calculates the thermal resistance in the heat dissipation path from the semiconductor chip based on the loss calculated by the loss calculation circuit and the temperature difference calculated by the temperature difference calculation portion; and
wherein the thermal resistance calculation circuit calculates an integrated value of losses occurring in the switching element and the temperature difference of the semiconductor chip based on time elapsed until saturation of temperature in the heat dissipation path from the semiconductor chip and a semiconductor chip temperature difference, and calculates the thermal resistance at a specific location on the heat dissipation path from the semiconductor chip;
the semiconductor device further comprising:
a control circuit that controls switching operation of the switching element;
a thermal resistance prediction circuit that calculates the switching element loss and temperature based on control information controlling the switching operation, and predicts the thermal resistance in the heat dissipation path from the semiconductor chip;
a comparison mechanism that compares the thermal resistance calculated by the thermal resistance calculation circuit with the thermal resistance predicted by the thermal resistance prediction circuit; and
a protection circuit that either halts operation of the switching element or limits the current flowing in the switching element, when the thermal resistance calculated by the thermal resistance calculation circuit exceeds the thermal resistance predicted by the thermal resistance prediction circuit.

* * * * *